United States Patent [19]

Prevot

[11] 4,012,705
[45] Mar. 15, 1977

[54] HIGH INPUT LEVEL MICROWAVE CIRCUIT

[75] Inventor: Julien Prevot, Paris Cedex, France

[73] Assignee: Societe Lignes Telegraphiques et Telephoniques, Paris, France

[22] Filed: Nov. 4, 1975

[21] Appl. No.: 628,845

[30] Foreign Application Priority Data

Nov. 29, 1974 France .............................. 74.39166

[52] U.S. Cl. .............................. 333/70 R; 328/167; 333/70 S; 333/73 S; 333/82 B; 333/80 T

[51] Int. Cl.² ..................... H03H 7/10; H03H 7/14; H01P 7/02; H01P 3/08

[58] Field of Search ............. 333/80 R, 80 T, 73 R, 333/70 R, 76, 84 R, 84 M, 82 R, 73 S, 82 B; 307/295, 322, 324; 328/167; 330/21, 195–197, 53–57

[56] References Cited

UNITED STATES PATENTS

| | | | |
|---|---|---|---|
| 2,662,122 | 12/1953 | Ryder | 330/53 X |
| 2,750,452 | 6/1956 | Goodrich | 333/80 T X |
| 3,348,160 | 10/1967 | Lee et al. | 330/195 X |
| 3,569,850 | 3/1971 | Wegener et al. | 330/56 |
| 3,721,918 | 3/1973 | Rosen et al. | 330/56 X |
| 3,723,773 | 3/1973 | Adams et al. | 307/295 |
| 3,852,680 | 12/1974 | Rosen et al. | 330/56 X |

*Primary Examiner*—Alfred E. Smith
*Assistant Examiner*—Marvin Nussbaum
*Attorney, Agent, or Firm*—Kemon, Palmer & Estabrook

[57] ABSTRACT

An active resonant circuit to be used as a cell for a low insertion loss high level microwave filter is disclosed comprising a circuit tuned at $f_o$ inductively coupled with a negative resistance amplifier consisting of a transistor with a cut-off frequency high with respect to $f_o$, an emitter circuit coupled to said tuned circuit, with a high transformer ratio, an adjustable tuned circuit in the base of said transistor and means for biassing said transistor for maximum negative resistance at $f_o$. Two or more cells may be associated to constitute a filter.

8 Claims, 8 Drawing Figures

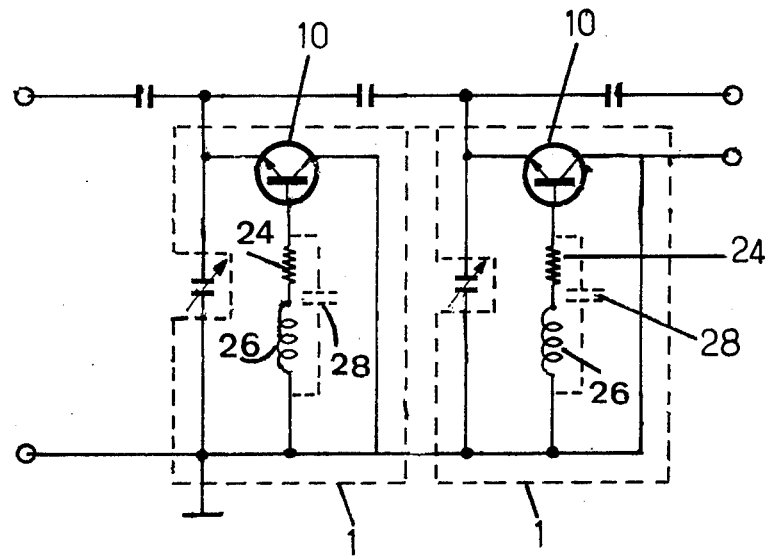
Fig:1
Prior Art
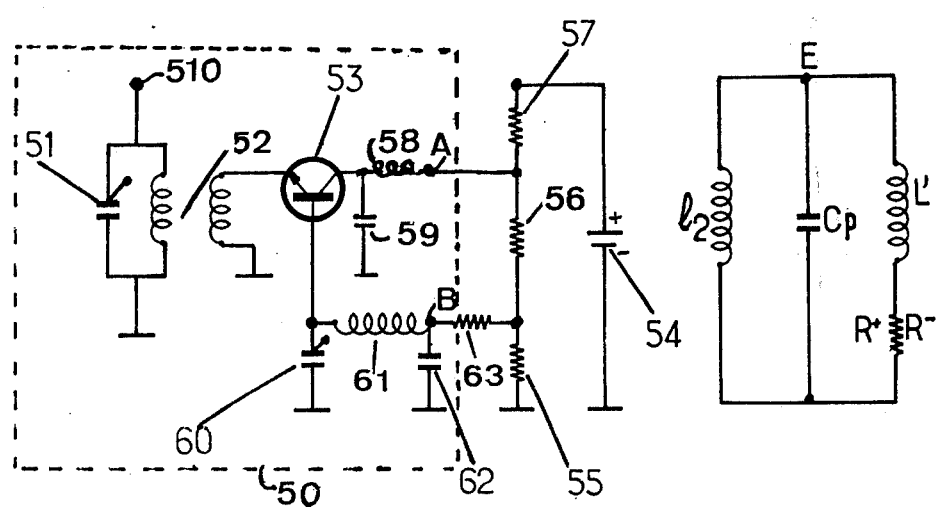
Fig:2a          Fig:2b

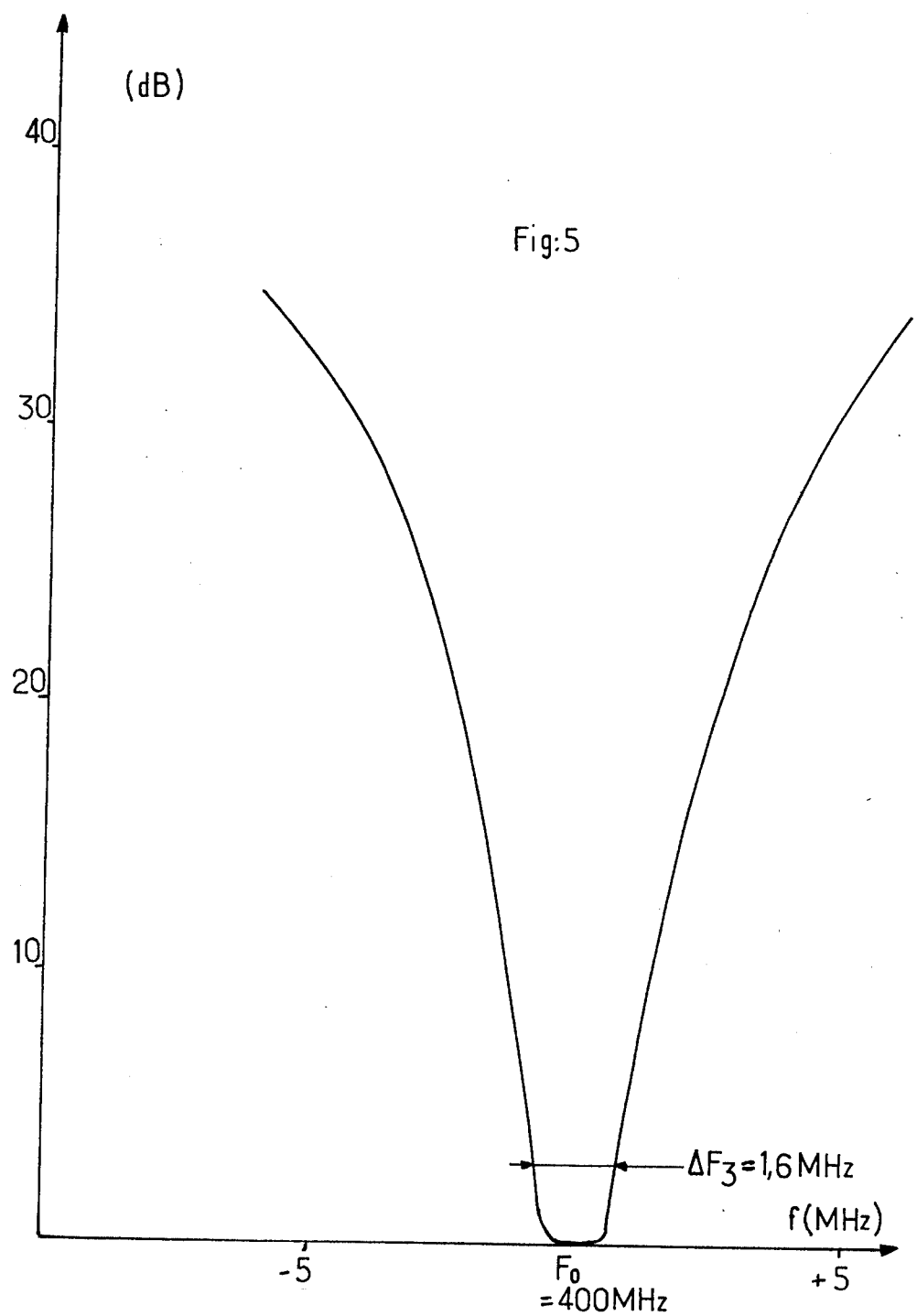

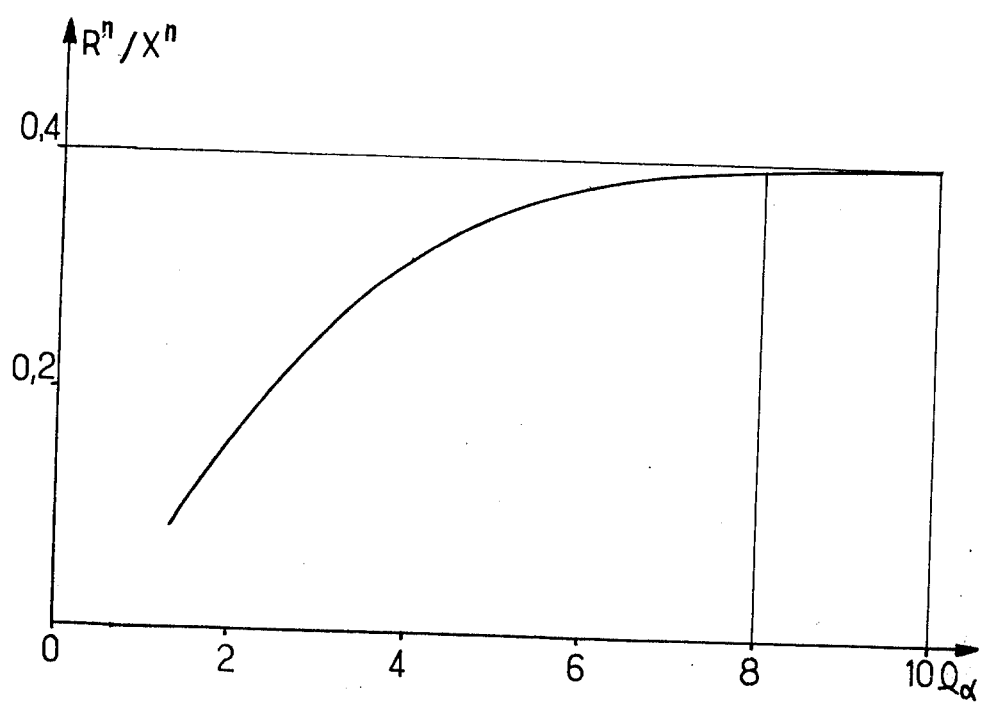
Fig:6

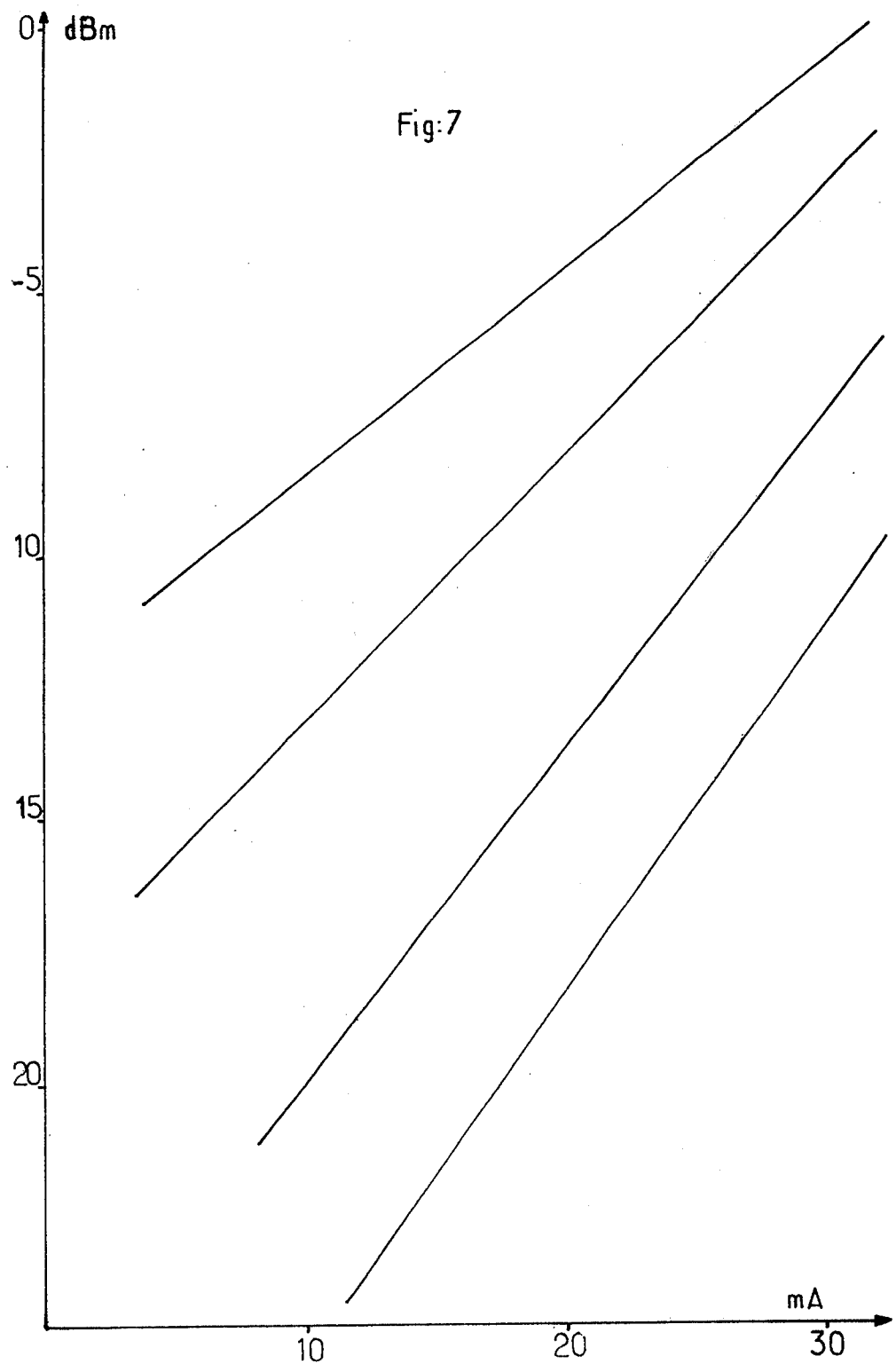

HIGH INPUT LEVEL MICROWAVE CIRCUIT

BACKGROUND OF THE INVENTION AND PRIOR ART

The present invention relates to an active resonant circuit designed to be incorporated in a fixed frequency microwave filter having a low insertion loss, a relative bandwidth equal at most to $10^{-2}$, which is designed for an input level of the order of 0 dBm, i.e. substantially 20 dB above that of filters commercially available at the present day.

The expression "microwave frequencies" refers to the frequencies ranging between $10^8$ and $2.10^{10}$ Hz. At the lower frequencies of this band, it is known to utilize semiconductors for loss compensation in filter circuits, in such manner that the attenuation be negligible in the bandwidth. The low frequency filters are not directly scalable at UHF and VHF frequencies due to the utilization of an active element, generally a transistor. The behaviour of the transistor at these higher frequencies leads to a rather complex equivalent circuit due to importance of stray impedances. Studies have been effected which have afforded solutions in some cases. U.S. Pat. No. 3,723,773, filed on the 27th May 1971, discloses a filter cell comprising a transistor connected in an inverted common collector circuit, and also two examples of filters the bandwidth of which is approximately 2% at 500 MHz. The main disadvantage of this embodiment consists in that this transistor connection forbids the application of an input level higher than approximately —20 dBm.

The present invention relates to pass-band filters having a relative bandwidth lower than $10^{-2}$ and which are insensitive to temperature, capable of operating at a high input mean power up to one milliwatt. A given type of transistor used in a filter according to the invention may be operated at a level higher than that of known filters utilizing the same transistor.

The filters according to the invention have a bandwidth which is sufficiently free from temperature variation to provide operation thereof at a fixed frequency with a bandwidth lower than 1%. The active resonant circuits according to the invention have a thermal drift coefficient at most equal to $10^{-5}$ per °C and an insertion loss close to 0 dB at an input level up to 1 milliwatt.

A further advantage of the invention consists in that setting of the relative bandwidth is independent of the tuning adjustment. The relative bandwidth may be selected within wide limits which may range between $10^{-2}$ and $10^{-4}$. This is achieved, once the circuit is set, by adjusting the emitter current. This adjustment simultaneously provides for compensation of the dispersion of the characteristics of the transistors. The input level limit is fixed by the breakdown voltage of the transistor and, as a first approximation, by the transformation ratio of the input transformer. Thus, it may also be set independently of the resonance frequency.

It is possible to increase the stability of the resonance frequency relative to the temperature by matching of the temperature coefficients of the coupling components.

SUMMARY OF THE INVENTION

The active circuit according to the invention comprises essentially the following elements:

- a passive circuit resonant on a frequency $f_o$ comprising a capacitor and the secondary of an impedance transformer;
- a transistor amplifier the emitter circuit of which comprises the primary of the said impedance transformer, whereas the base circuit thereof comprises a tuned circuit, and whereof the electrodes are biased for maximum negative resistance at frequency $f_o$ and a cut-off frequency very high with respect to $f_o$.

According to a preferred variant of the invention, the bias voltage of the base of the amplifier is stabilized against temperature variations.

One or more active circuits according to the invention may be associated to constitute a filter. In such utilization, the circuits may be coupled with each other and with the external circuits through passive elements the temperature coefficients of which are selected in such manner as to compensate for the temperature variations of the circuits, at least partially.

BRIEF DESCRIPTION OF THE DRAWINGS

FIG. 1 shows a prior art resonant circuit of the inverted common collector type;

FIG. 2a shows a resonant circuit according to the invention;

FIG. 2b shows the electrical diagram equivalent to the preceding one;

FIG. 5 is a two-cell filter characteristic according to the invention;

FIGS. 6 and 7 comprise curves summing up the characteristics of a circuit according to the invention.

DETAILED DESCRIPTION OF THE INVENTION

Figure 3:
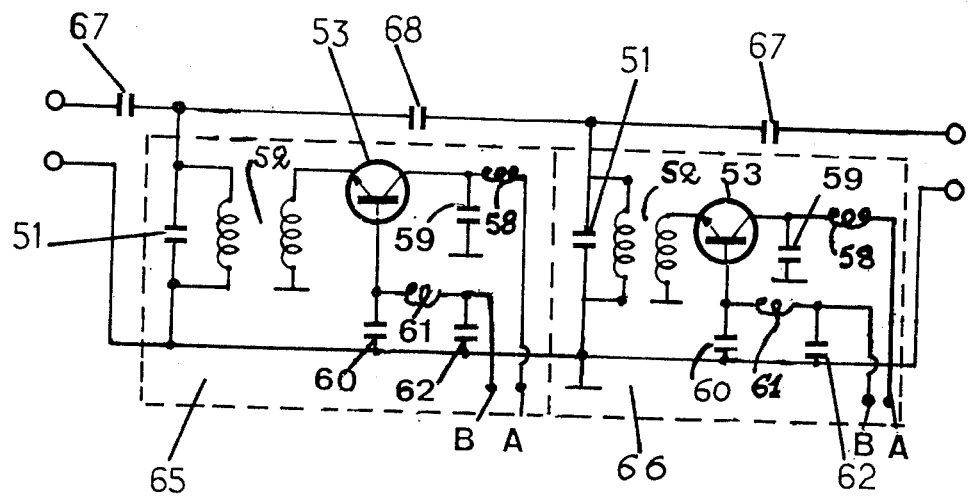
FIG. 3 shows the electrical diagram of a pass-band two circuit filter, according to the invention.

FIG. 1 shows a filter according to U.S. Pat. No. 3.723.773, comprising two cells 1 each constituted by a transistor 10 connected according to the inverted common collector circuit.

In the said cells, capacitor 28 shown in dotted line corresponds to the base-collector capacitance of the transistor. The base-collector resistor of the transistor has been incorporated in resistor 24. The inductance 26 includes the inductance due to the transistor. FIG. 1 does not show the d.c. supply for the transistor which, according to the specification, is conncted between the emitter and the base, the collector being connected to a reference potential.

FIG. 2a shows, within the dotted frame 50, the diagram of the resonant circuit according to the invention and, externally of the frame, the supply necessary for operation thereof. The circuit according to the invention comprises a first adjustable capacitor 51, a transformer 52, a transistor 53, a cell for filtering the collector voltage constituted by the inductor 58 and the capacitor 59, and a resonant circuit connected to the base of the transistor 53, constituted by the adjustable capacitor 60 and the inductor 61. The capacitor 51 has one electrode connected to the reference potential and one electrode connected to the input 510 of the circuit. The transformer 52 of ratio n equal at least to 3 has its secondary connected in parallel to the capacitor 51 and its primary connected at one end to the reference potential and at the other end to the emitter of the transistor 53. The collector of the transistor 53 is maintained through inductor 58 to the d.c. voltage of the terminal A of the supply.

One end of the inductor 61 is connected to the base of the transistor 53 and the other to the unidirectional voltage supply terminal B. A filtering capacitor 62 connects the terminal B to the reference potential. The adjustable capacitor 60 constitutes, with the inductance 61, a resonant circuit serving for adjusting the circuit according to the invention (as will be explained later). The d.c. supply of the transistor comprises a source 51 one terminal of which is connected to the reference potential and the other to a resistor bridge comprising resistors 55, 56 and thermistor 57.

Terminal B of the circuit according to the invention is connected to an adjustable resistor 63 the second terminal of which is connected to the point common to resistors 55 and 56. The thermistor is selected to be of value such that, taking into account the current limiting resistor 63, the potential at point B is practically constant when the temperature varies between −20 and +50° Celsius. Terminal A is connected to the point common to the resistors 56 and 57. The resonant circuit 51-52 is called the main circuit.

FIG. 2b shows the microwave circuit equivalent to the amplifier stage of FIG. 2a. The inductor $I_2$ is that of the emitter circuit of 53 corresponding to point E. The transistor is replaced by the circuit comprising $C_p$ (input capacity), $L'$ (inductor equivalent to the transistor and to the base circuit) and $R^+ + R^-$ representing simultaneously the losses in the circuits associated with the transistor ($R+$) and the amplification of the transistor ($R^-$).

In the circuit according to the invention, there is to be selected $l_2 << L_1$ where $L_1$ is the inductor of the primary winding, which corresponds to a high decoupling between the main circuit and the transistor, thereby promoting the increase in the power which may be applied to the main circuit without inconvenience for the transistor.

Referring to the circuits of FIG. 2a, it will be perceived that the emitter voltage $V_E$ $$V_E = \frac{V_o L'}{L' + L_1}$$

where $V_o$ is the input voltage and $L'$ the inductor equivalent to the transistor.

The condition $l_2<<L'$ and $C_p<<C_1$, $C_1$ corresponding to capacitor 51, should also be met. It should be clearly understood that the operating frequency $f_o$ is selected to be such that $f_o<f_\alpha$, where $f_\alpha$ or $f_{h21b}$ is the cut-off frequency of the common base current gain. According to the essential feature of the invention, the operating conditions of the transistor are set in such manner that the values of $R^-$ and $R^-/L'$ are in maximum at resonance frequency $f_o$ of the main circuit. An explanation will be given hereinbelow as to how it is possible to meet this requirement, from the transistor characteristics.

By way of illustrative and non-limitative example, a 400 MHz resonant circuit has been designed with a 2N3866 transistor and the following components:

a transformer 52 the primary of which is constructed in a single turn and the secondary of which has three turns of silver wire wound on a dielectrical mandrel a few millimeters in diameter;

an inductor 61 close to 10 nH, constituted by one turn of silver wire wound on a mandrel 5 mm in diameter;

a capacitor 62 the value of which is close to 1000 pF;
a resistor 58 of 100 ohms;
a resistor 63 of 470 ohms;
a capacitor 51 adjustable between 1 and 6 pF;
a capacitor 60 the value of which is close to 10 pF;
a capacitor 59 the value of which is equal to 1000 pF.

The characteristics of this circuit are summed up by the following values:

3 dB relative bandwidth : $2.5 \cdot 10^{-4}$;
thermal drift : lower than $10^{-5}$ per degree Celsius;
noise factor : 20 dB;
maximum input power without distortion: 0.5 milliwatt;
maximum input power tolerated without degradation of the transistor : 100 milliwatts.

FIG. 3 shows the diagram of a filter comprising two resonant circuits according to the invention, shown within the frames 65 and 66. Two capacitors 67 having the same capacitance connect respectively the input of the filter to the first circuit and the second circuit to the filter output, whereas a capacitor 68 connects the two circuits together. Since the capacitances of the capacitors 67 and 68 are a function of the temperature, temperature compensation of the frequency variations is achieved by associating capacitors of different types and temperature coefficient. By way of non-limitative example, "teflon" capacitors 67 may be associated with a ceramic capacitor 68.

By way of example, a filter has been designed with a bandwidth adjustable to any value ranging between 2.5 and 0.5 MHz, the central frequency being fixed at 400 MHz and the thermal drift for the filter assembly being lower than $10^{-6}$ per degree Celsius. This filter receives without distortion an input power of 1 milliwatt, and the noise factor is equal to 9.5 dB when the bandwidth is 2 MHz. The characteristic of this filter is shown in FIG. 5.

Such a filter may be connected betwen two low noise amplifiers when it is necessary to improve the noise factor.

Figure 4:
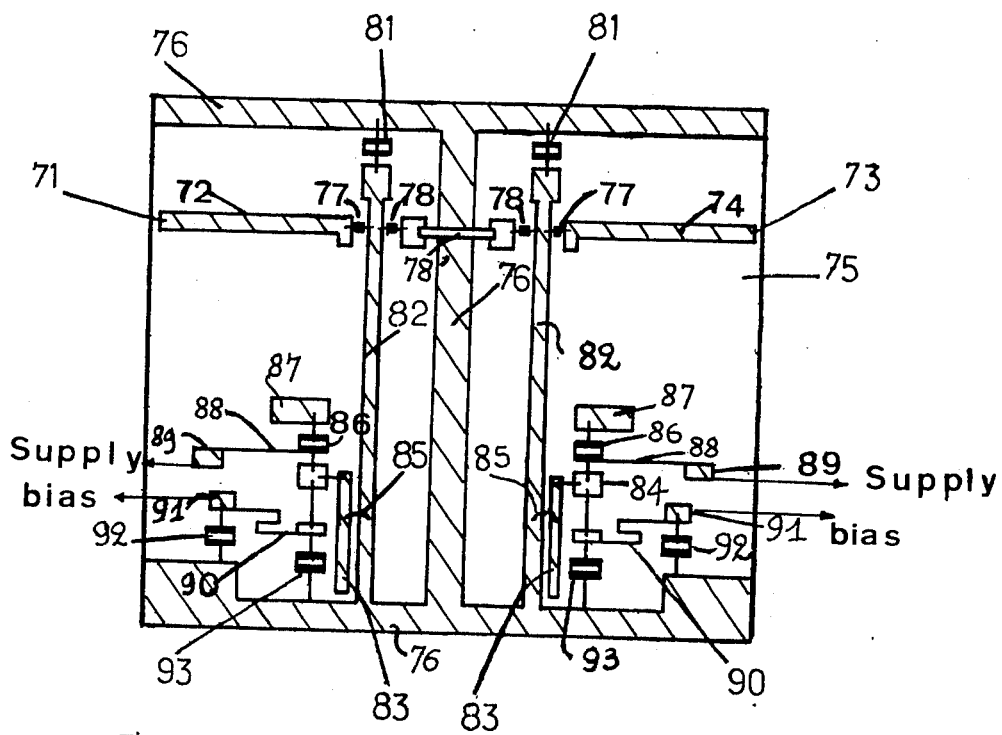
FIG. 4 shows a filter having two cells designed in accordance with the hybrid circuit technology.

FIG. 4 shows a two cell filter according to the invention, made by hybrid circuit technology. The filter is constituted of films locally deposited on one of the faces of an alumina substrate 75 on which are mounted lumped components. The non-visible face of the alumina substrate 75 is coated with a continuous gold film. The visible face shows metallization 76 separating the two filter cells and bordering the latter at three sides, it is connected to the said continuous gold film and sets the reference voltage. The filter input is connected to the end 71 of microstrip 72 and the output to the end 73 of the microstrip 74; the roles of 71 and 73 may be reversed.

The components of the electrical diagram of FIG. 3 may be identified one by one with the components of FIG. 4. The capacitors 77 correspond to the capacitors 67, the two capacitors 78 connected in series by a conductor bridge 78' insulated from the deposit 76 by insulating means have values equal to double the value of the capacitor 68. The capacitors 81 correspond to the capacitors 51 and fix the resonance frequency of the filter. The transformer 52 is constituted of the microstrips 82 and 83. The first thereof, which is short circuited at one of its ends by the metallization 76, is connected to the capacitors 77, 78 and 81 at the other end. Its length is comprised between an eighth and a quarter of the wavelength at resonance frequency. The microstrip 83, located parallel and of length close to 25% of that of line 82, is arranged in the vicinity of the short circuited end of 82, at a distance equal to 5% of the length of 82, starting from the metallization 76. To transistor 53 of FIG. 4 corresponds the transistor 84 constituted by a chip mounted on the substrate. The emitter of transistor 84 is connected by gold wire to the microstrip 83 and the lead 85 between 83 and 82 maintains the emitter at the reference voltage. The connection of the lead 85 fixes the transformation ratio n of transformer 52.

The collector of transistor 84 is connected to a capacitor 86 (59 in FIG. 3) whereof one electrode is maintained at the reference voltage by a metallization 87 contacting the lower metallized face of the substrate and connected by a filtering inductor 88 connected to a terminal 89 to which is applied the supply voltage for the collector. The base of the transistor 84 is connected to an inductor 90 corresponding to the inductor 61 of FIG. 3. The latter terminates in a terminal 91 for application of the bias voltage to the base. The capacitor 92 decouples the bias supply (62 in FIG. 3). The transistor base is furthermore connected to a capacitor 93 corresponding to the capacitor 60 of FIG. 3.

By way of illustrative and non-limitative example, a two cell filter was designed with the following components :
- transistor : type BFW 41 manufactured by the applicants
- capacitor 81 adjustable between 0.5 and 11.5 pF
- fixed capacitors 86 – 100 pF
  fixed capacitors 92 – 100 pF
  capacitors 93 adjustable between 0.5 and 3 pF
- inductors 88 – 10 nH
- inductors 90 – 10 nH It has the following characteristics :
- resonance frequency : 1320 MHz (Band L)
- 3 dB bandwidth : 10 MHz
- maximum permissible input power without distortion : 1 milliwatt
- insertion loss at 1320 MHz : 0 dB
- coefficient of variation of the resonance frequency as a function of the temperature : lower than $10^{-6}$ per degree Celsius Frequencies higher than those of the band L (1300 MHz) may be attained, since the dimensions of the elements of the hybrid circuit may be still considerably reduced. Furthermore, transistors are available having a cut-off frequency higher than that of the transistor BFW41 mentioned. For example, the transistors X 56 manufactured by the applicants have a cut-off frequency at 6 GHz; they permit production of filters according to the invention up to 5 GHz. Furthermore, transistors having a transition frequency close to 13 GHz and permitting the production of filters up to 10 GHz are already commercially available.

In order to set the values of the circuit elements to design a pass-band filter the central frequency of which is fo, the procedure is as follows. The characteristics of the transistor mention the value of the cut-off frequency of the transistor $f\alpha$ (most frequently under the reference $f_{h2lb}$). Selection of the transistor is effected to meet the requirement: the condition $f\alpha < f_o$. The parameters to be selected are the values of the elements external to the transistor constituting the base circuit and the emitter circuit whilst taking account of the internal resistors and capacitor of the transistor which are shown on the manufacturer's characteristics.

The input impedance of the amplifier stage, which is in parallel on the inductor $l_2$ may be written as : $Z = Z_e + Z_b (1 - \alpha)$
wherein
$Z_e$ = impedance of the emitter circuit
$Z_b$ = impedance of the base circuit
$\alpha$ = amplifier gain At high frequencies, it is allowed to write : $Z_e \simeq r_e \alpha$ wherein $r_e$ is the resistance as seen from the emitter and
$$\alpha = \alpha_o \frac{e^{-jMF/F\alpha}}{1 + j f/f\alpha}$$

Putting $x = f/f\alpha$ and effecting the microwave simplifications, such as $\alpha_o = 1$, there is obtained :

$$Z' = r_e + Z_b \left(1 - \frac{1 - jMx}{1 + jx}\right)$$

Putting :

$$Q_\alpha = \frac{L_b \omega_\alpha}{r_b} \quad \text{with} \quad \begin{array}{l} r_b = r_{\text{junction}} + r_{\text{external}} \\ L_b = L_{\text{junction}} + L_{\text{external}} \end{array}$$

which is the overvoltage coefficient at the cut-off frequency of the circuit equivalent to the transistor + base circuit subunit, the following is obtained :

$$\frac{Z'}{r_b} = \frac{r_e}{r_b} + R^N + jX^N$$

with $$R^N = (1 + M) \left\{ \frac{x^2 \left[1 - Q_\alpha + \frac{A^2}{Q_\alpha}\right] + x^2 A^2 Q_\alpha}{(1 + x^2)(1 - A^2 x^2)^2 + \left(\frac{x^2 A^2}{Q_\alpha}\right)^2} \right\}$$

$$X^N = (1 + M) \left\{ \frac{x \left[1 + x^2 \left(Q_\alpha - \frac{A^2}{Q_\alpha}\right) - x^4 A^2 Q_\alpha\right]}{\left[(1 + x^2)(1 - A^2 x^2)^2 + \frac{x^2 A^2}{Q_\alpha}\right]} \right\}$$

wherein
$A = f\alpha / f_1$ with $f_1$ = resonance frequency of the transistor + base circuit. This is defined by the values of A and Q.

As stated hereinabove, the transistor behaves as an amplifier. In order to achieve stability, it is desirable that the operating frequency should be close to a value such that the corresponding value of $R^N$ is extreme and, more particularly, minimum : i.e. $dR^N/dx$ is annulled. From the corresponding values of $x$, the frequency values satisfying this condition are obtained. One of them should be equal to $f_o$. It is possible to establish tables for each type of transistor affording the values of $f_s/f\alpha$ corresponding to the maximum stability as a function of the parameters A and $Q_\alpha$. Calculations of the same nature make it possible to evaluate the ratio $R^-/L'$, such as defined in FIG. 2b, and to set a second condition making it possible to fix the two parameters A and $Q_\alpha$.

It is possible to plot at the frequency values corresponding to stability ($R^-/L'$ maximum) the curve $R^N/X^N$ as a function of $Q_\alpha$ for $f_s = f_o$. FIG. 6 shows such a curve for a transistor type 2N3866 and $f_s = f_o = 400$ MHz.

It is found that for $Q\alpha > 5$, $R^N/xN$ remains at a maximum close to 0.4, which signifies that rb will have to be low.

On plotting the value $Q_\alpha$ thus fixed on a table representing $x$ as a function of A, A may be obtained, which gives the tuning frequency of the transistor + base circuit assembly. The data r junction and L junction are given by the transistor manufacture. Therefrom is deduced r external and L external. In the case of the transistor under consideration, $A = 1.1$ $fl = 550$ MHz and $Q = 5$, which leads to L external = 32 nH and $0 < r$ external $< 15$ ohms. As a variant, it will be possible to connect in parallel on $C_b$ ($C_b = 2.5$ pF) a 5.5 pF capacitor the external resistance of which is 10 ohms and the inductor of which is 20 nH.

A supplementary parameter of the circuit consists in the value of the collector current of the transistor. It fixes the input power admissible without distortion. It is possible, for each amplifier determined as indicated hereinabove, to plot the curve of variation of the admissible power limited to the compression point - 1dB, as a function of the collector current for a given bandwidth of the filter. The curves of FIG. 7 give the curves measured on a filter having two cells and functioning at $f_o = 400$ MHz, designed in accordance with the diagram of FIG. 2 with 2N3866 transistors.

What we claim:

1. An active high level microwave resonant circuit with relative bandwidth smaller than $10^{-2}$ comprising:
   a resonant circuit tuned to the operating frequency $f_o$ and including a capacitor and an inductor, said inductor being the secondary winding of a coupling transformer with a low coupling coefficient;
   a transistorized amplifying stage having an emitter input circuit including an inductor which is the primary winding of said coupling transformer;
   an auxiliary resonant circuit connected to the base of said transistorized stage and tuned to $f_1$ different from $f_o$;
   an output collector circuit; and
   means for biasing the electrodes of said transistorized stage; said frequency $f_1$ and said bias voltage values being selected so that the equivalent negative resistance $R^-$ seen at said emitter input is a maximum at $f_o$.

2. An active high level microwave resonant circuit according to claim 1, in which the coupling coefficient of said coupling transformer is smaller than 0.3.

3. An active high level microwave resonant circuit according to claim 1, in which said auxiliary resonant circuit consists of an inductor of value L such that ratio $R^-/L$ of the negative resistance seen at the emitter input circuit of said transistorized stage to said inductor value is maximum at $f_o$.

4. An active high level microwave resonant circuit according to claim 1, in which said auxiliary resonant circuit frequency $f_1$ is much higher than $f_o$.

5. A hybrid circuit according to claim 1, in which said coupling transformer secondary is a first open ended microstrip connected at its other end to a capacitor and said transformer primary is a second microstrip parallel to said first microstrip with one end short circuited and connected to said first microstrip at intermediate points on both strips set to fix the coupling coefficient and the second end is connected to said transistor emitter.

6. A hybrid circuit according to claim 5, in which the microstrip constituting said coupling transformer secondary has a length between one-eighth and one-quarter wavelength at $f_o$.

7. A circuit according to claim 5, in which said first strip has a first end located at most at 1.2/100 wavelength from the short circuited end of said second strip and a second end located at 7.5/100 wavelength from said short circuited end.

8. A filter comprising at least two active resonant circuits according to claim 1, interconnected by coupling capacitors connected between the collector circuit of one circuit and the emitter circuit of the following circuit and a first capacitor connected to the emitter circuit of the first active circuit and a last capacitor connected to the collector circuit of the last active circuit in which the temperature coefficient of said coupling capacitors and the temperature coefficient of said first and last capacitors are such as to compensate for their respective frequency mismatch with temperature.

* * * * *